United States Patent [19]

Mori et al.

[11] Patent Number: 4,503,539
[45] Date of Patent: Mar. 5, 1985

[54] SEMICONDUCTOR LASER

[75] Inventors: Yoshifumi Mori; Osamu Matsuda, both of Yokohama, Japan

[73] Assignee: Sony Corporation, Tokyo, Japan

[21] Appl. No.: 599,224

[22] Filed: Apr. 13, 1984

Related U.S. Application Data

[63] Continuation of Ser. No. 283,536, Jul. 15, 1981, abandoned.

[30] Foreign Application Priority Data

Jul. 16, 1980 [JP] Japan ................................ 55-97398

[51] Int. Cl.³ ............................................... H01S 3/19
[52] U.S. Cl. ......................................... 372/45; 357/17; 357/60; 372/46
[58] Field of Search ...................... 372/46, 48, 45, 44; 357/17, 60

[56] References Cited

U.S. PATENT DOCUMENTS 4,251,298 2/1981 Thompson .......................... 372/48

OTHER PUBLICATIONS

Mori et al., "V-DH Laser: A Laser with a V-Shaped Active Region Grown by Metalorganic C.V.D.", *Electronics Letters*, vol. 16, No. 20, Sep. 25, 1980, pp. 785-787.

*Primary Examiner*—James W. Davie
*Attorney, Agent, or Firm*—Hill, Van Santen, Steadman & Simpson

[57] ABSTRACT

A new laser structure having self-aligned junction stripe geometry grown by the MO CVD process is disclosed. The laser is grown on a groove-etched substrate and has a DH structure with a small V-shaped active region. A current path in the V-shaped region is formed using anomalous zinc diffusion during growth, which allows a broad area metal contact for both sides of the wafer.

4 Claims, 6 Drawing Figures

SEMICONDUCTOR LASER

This is a continuation of application Ser. No. 283,536 filed July 15, 1981, now abandoned.

BACKGROUND OF THE INVENTION

The invention relates to a semiconductor double-hetero (DH) structure laser and its manufaturing method by metalorganic chemical vapor deposition (MO CVD).

Single mode operation of AlGaAs/GaAs DH lasers is known in a variety of structures including buried hetero structures, channeled-substrate planar structures, transverse junction stripe structures, and self-aligned structures. These are made by the liquid phase epitaxy (LPE) process.

A channel-guide structure made by the MO CVD process successfully operating in a single mode is known (Appl. Phys. Lett. 33, 724 (1978) but its CW threshold current is more than 200 mA.

OBJECTS AND SUMMARY OF THE INVENTION

Therefore, it is an object of the invention to provide an improved structure of DH laser.

It is a further object of the invention to provide an improved method of making a DH laser.

According to the invention, there is provided a new structure laser having self-aligned junction stripe geometry grown by the MO CVD process. The laser is grown on a groove-etched substrate and has a DH structure with a small V-shaped active region. Current path in the V-shaped region is formed using anomalous zinc diffusion during growth, which allows a broad area metal contact for both sides of the wafer.

The other objects, features and advantages of the present invention will become apparent from the following description taken in conjunction with accompanying drawings through which the like references designate the same elements and parts.

DESCRIPTION OF THE PREFERRED EMBODIMENTS

Figure 1:
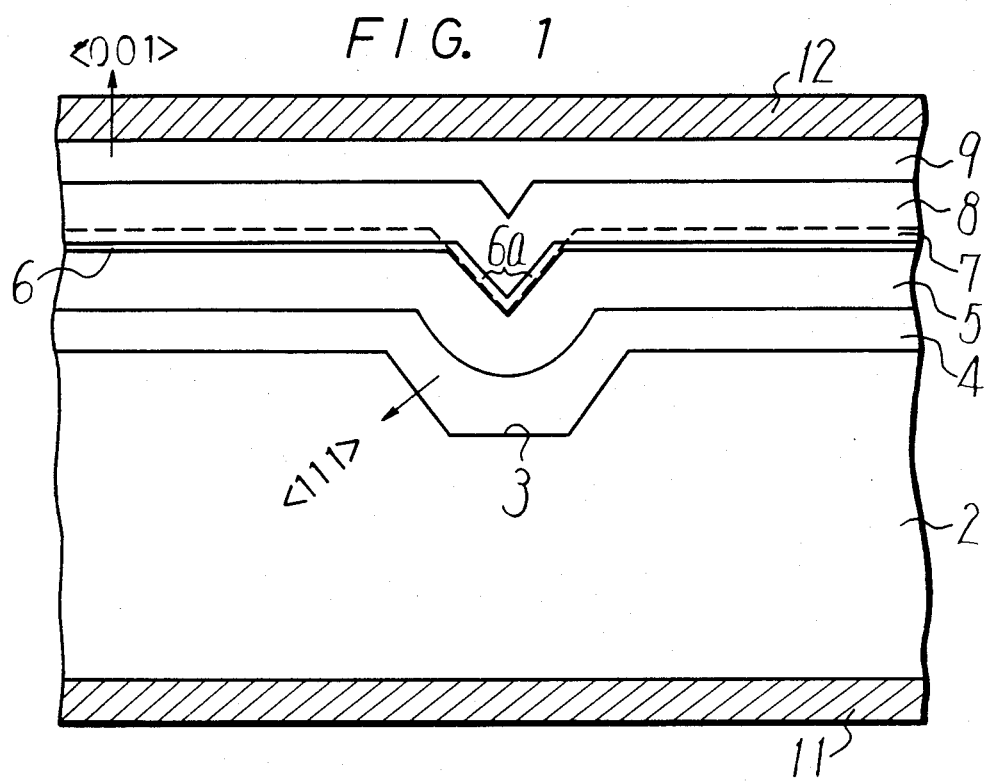
FIG. 1 is a cross section of a DH laser diode.

Referring FIG. 1, there is shown a $(01\bar{1})$ plane cross section of a laser 1 in accordance with the invention. A substrate 2 is a (100) oriented n-type GaAs doped with $2 \times 10^{18}$ cm$^{-3}$ Si, of which upper surface is groove-etched along <110> direction. Stripe windows of 1 $\mu$m width on a photoresist mask are formed by photolithography. Crystallographic etching solution $H_3PO_4$—$H_2O_2$—$H_2O$ (1:1:10 by volume) provides a groove 3 of about 1 $\mu$m depth and 2 $\mu$m width, which has a U-shaped cross section and (111) slanting planes.

Five epitaxial layers are grown by controlling the flow rates of reactant gases. The first layer 4 as a buffer is n-type GaAs of 0.3 to 0.5 $\mu$m thickness doped with $1 \times 10^{18}$ cm$^{-3}$ Se. The second layer 5 as a clad layer is n-type Al$_{0.34}$Ga$_{0.66}$As of 0.7 $\mu$m thickness doped with $1 \times 10^{17}$ cm$^{-3}$ Se. The third layer 6 as an active layer is n-type pure GaAs of 0.1 $\mu$m thickness. The fourth and fifth layers 7 and 8 as clad layers are n-type and P-type Al$_{0.34}$Ga$_{0.66}$As of 0.2 $\mu$m and 0.7 $\mu$m thickness doped with $1 \times 10^{17}$ cm$^{-3}$ Se and $5 \times 10^{17}$ cm$^{-3}$ Zn, respectively. The clad layers 5 and 7 have a wider energy band gap and a smaller refractive index than those of the active layer 6. The sixth layer 9 as a capping layer is P-type GaAs of 0.3 $\mu$m thickness doped with $4 \times 10^{18}$ cm$^{-3}$ Zn.

The main reactant gases are trimethyl alminum (TMA), trimethyl gallium (TMG) and arsine as sources of Al, Ga and As, respectively. Hydrogen selenide and diethyl zinc are used as dopants for n- and p-type conductivity layers, respectively. The flow rate of alkyle compounds is from 0.5 to 1.0 ml/min. The partial flow rate of arsenic to the column III elements is higher than ten. The total carrier flow rate is usually 4 l/min. The growth rate is around 0.2 $\mu$m/min.

The groove 3 becomes narrower as the thickness of the grown layer increases, and it gradually assumes a V-shape surrounded by (111) A planes. The growth rate on the (111) A plane is nearly equal to the rate on the (100) plane. When the total thickness of the grown layers reaches 2 $\mu$m the groove is almost buried. The resultant flat surface is desirable for device fabrication. The width of a V-active region 6a which is a bent part of the active layer 6 is controlled by varying the width of the original groove 3 and the thickness of the first and second layers 4 and 5. In the present case, the depth and width of the resultant V-active region 6a is about 1 $\mu$m.

Zinc diffuses anomalously faster in the grooved region than on the flat surface. Its possible origin might be the difference of doping efficiency between the layers grown on (111) A and (100) planes caused by the stress field around the groove. The phenomenon is used for confining a current path in the grooved region.

Figure 2A:
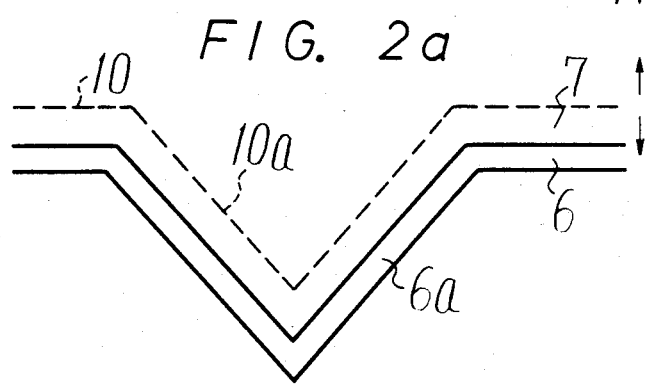
FIGS. 2(a) and 2(b) are schematic illustrations of impurity diffusion.
Figure 2B:
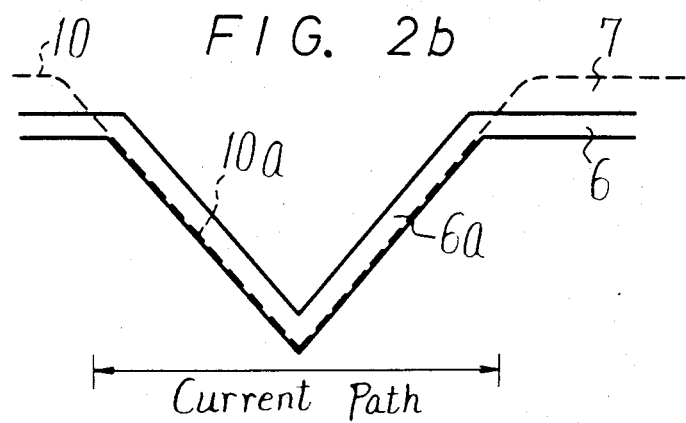

FIGS. 2(a) and 2(b) are schematic illustrations showing how the diffusion proceeds. The dopant is switched from Se to Zn after the AlGaAs fourth layer 7 is grown. FIG. 2(a) shows the As-doped impurity distribution. The Zn doped in the AlGaAs fifth layer 8 diffuses preferentially into the AlGaAs fourth layer 7 and reaches the GaAs active layer 6 in the groove during the growth. FIG. 2(b) shows the final structure. In the flat region, the p-n junction 10 is located between the AlGaAs fourth and fifth layers 7 and 8. In the groove, it is located in or at the bottom of the GaAs active layer 6, that is around the boundary between the second and third layers 5 and 6. Zn can be, alternatively, diffused subsequent to the deposition of the layer 8 or 9.

The current path is limited to the area of the groove because the p-n junction 10a in the groove has a smaller diffusion potential than the p-n junction 10 in the flat region has. The structure has a junction stripe geometry with a built-in refractive index difference, where the GaAs active region 6a is laterally sandwiched between the AlGaAs layers 5 and 7. The self-aligned junction stripe geometry makes the fabrication process quite simple. Ohmic contacts 11 and 12 on lower and upper sides of the wafer are formed over the whole surfaces with Au-Ge alloy and successive Ti/Pt/Au layers, respectively. Individual laser diodes with a length of about 250 $\mu$m are separated by cleavage. They are soldered p-side up with indium to small copper heat sinks.

Figure 3:
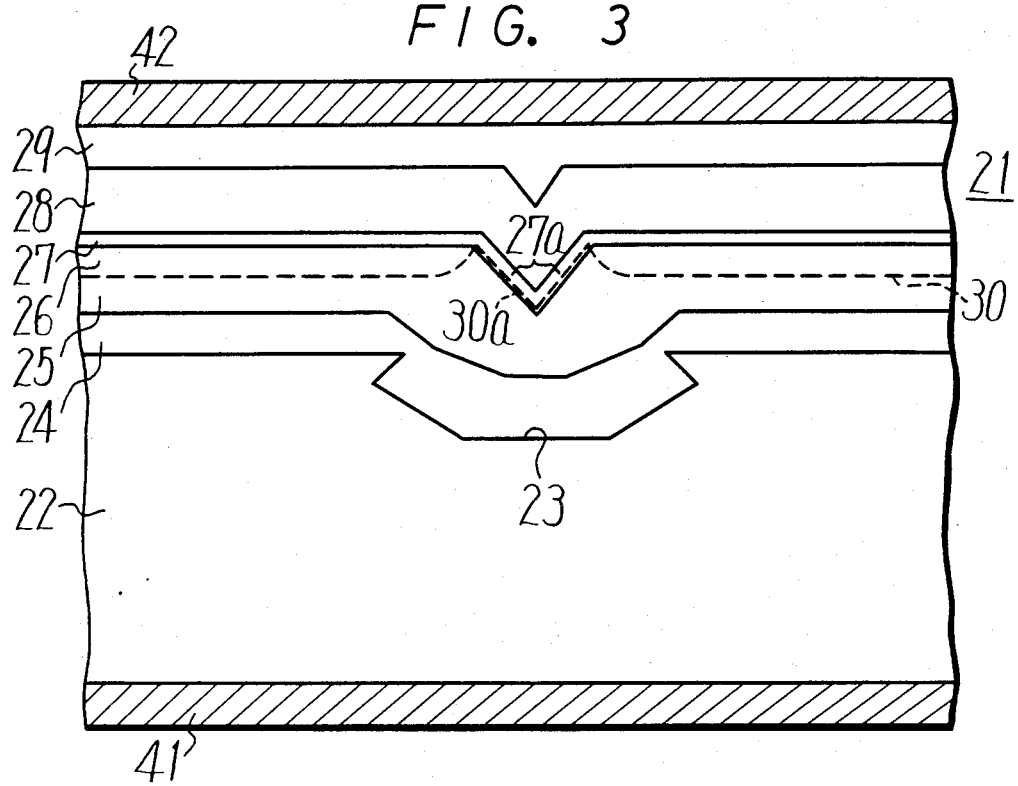
FIGS. 3 and 4 are cross sections of other embodiments.

The etched groove can be oriented in the $<1\bar{1}0>$ direction, in which the slanting planes are nearly (311)B planes. The diffusion of Zn is remarkably suppressed in the groove. A p-n junction 30 formed by Zn diffusion is located in the AlGaAs second and third layers 25 and 26 in the flat region, and in or at the bottom of the active region 27a in the groove. The current path is limited to the area of the groove. FIG. 3 shows the device made by this process.

Figure 4:
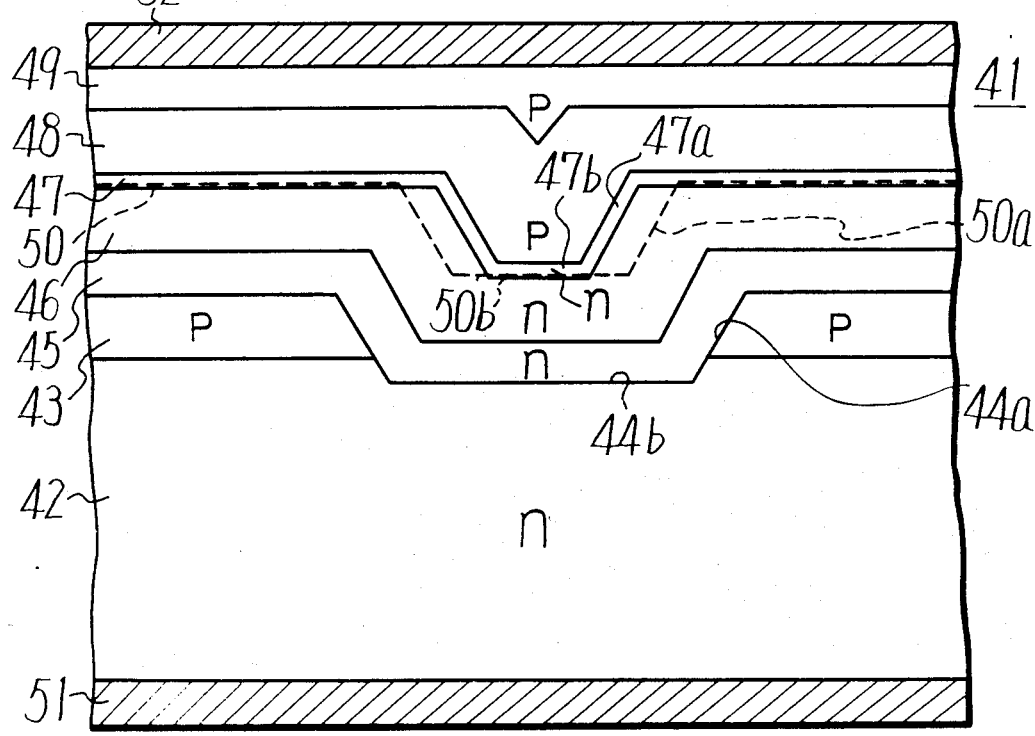

FIG. 4 shows another embodiment. The groove 44 along <1$\bar{1}$0> direction has such a width that an active layer 47 has a narrow bottom flat region 47b in the groove. A p-n junction 50 is located in or at the bottom of the GaAs active layer 47 and 47b in the flat regions, and in the lower AlGaAs layer 46 in the slating area. The current path is limited to the flat area of the groove, provided that the rest of the surface of the substrate 42 is transformed into a p-type layer 43 to form a current barrier.

Figure 5:
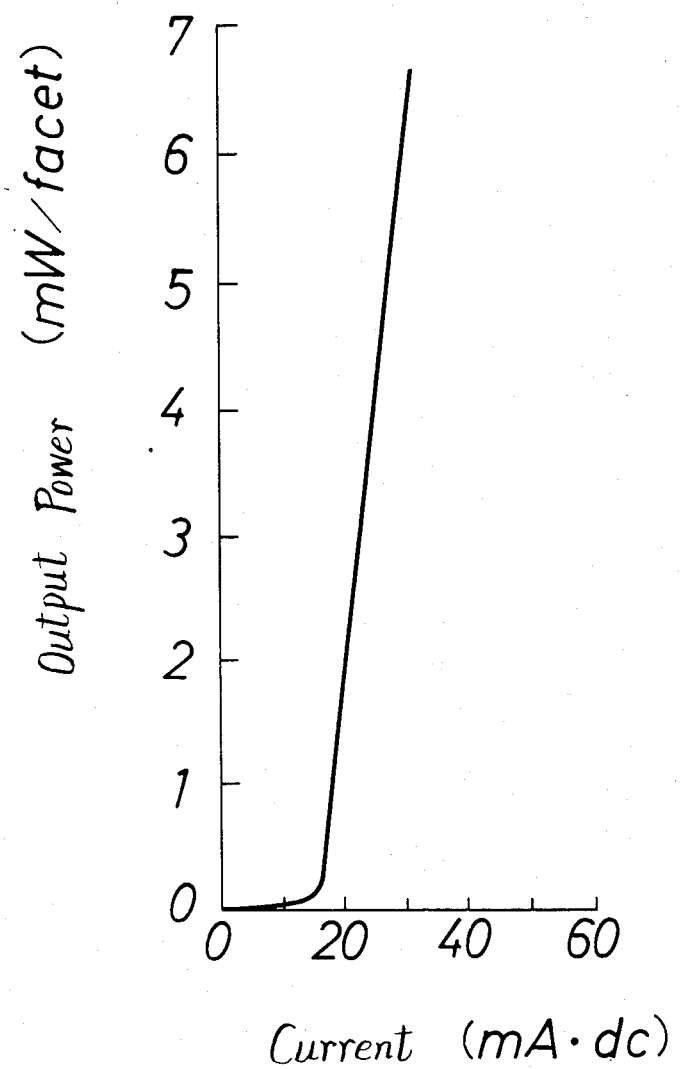
FIG. 5 shows the characteristic of the device.

FIG. 5 shows the relation of light output power to dc current at room temperature. The lowest threshold current of this diode is 15 mA. The maximum output power per facet is from 15 to 18 mW for uncoated devices, and is up to 40 mW for the $Si_3N_4$ coated devices. The maximum density of power is high because of the narrow current path of about 1 μm. The differential quantum efficiency of the diode is 65%. The laser operates predominantly in a single mode over a wide current range. The beam shape is nearly circular with an aspect ratio less than 1.5. Some coated devices have been operating for more than 3000 hours with gradual increase of the driving current at an output power of 4 mW/facet at room temperature.

The above description is given on preferred embodiments of the invention, but it will be apparent that many modifications and variations could be effected by one skilled in the art without departing from the spirits or scope of the novel concepts of the invention, so that the scope of the invention should be determined by the appended claims only.

We claim as our invention:

1. In a semiconductor laser comprising: a planar semiconductor substrate having an elongated groove with slanting planar surfaces in one of its planar surfaces, a semiconductor active layer formed on said one planar surface, an active region aligned with said groove and having planar surfaces parallel to the slanting planar surfaces of said elongated groove, a pair of semiconductor layers sandwiching said active layer and having wider energy gaps than said active layer, and a p-n junction having a first part adjacent said active region and a second part in one of said pair of semiconductor layers.

2. A semiconductor laser according to claim 1, in which said one planar surface is in the (100) plane.

3. A semiconductor laser according to claim 2, in which said groove is elongated along the <110> direction and has slanting (111) planes.

4. In a semiconductor laser comprising: a planar semiconductor substrate having an elongated groove with slanting planar surfaces in one of its planar surfaces, a semiconductor active layer formed on said one planar surface, an active region aligned with said groove and having planar surfaces parallel to the slanting planar surfaces of said elongated groove, a pair of semiconductor layers sandwiching said active layer and having wider energy gaps than said active layer, and a p-n junction having a first part adjacent said active region and a second part in one of said pair of semiconductor layers, in which said one planar surface is in the (100) plane, and in which said groove is oriented in the <110> direction and has slanting surfaces which are nearly in (311) B planes.

* * * * *